United States Patent [19]

Hesse et al.

[11] 4,265,723

[45] May 5, 1981

[54] PHOTOCURABLE MOLDING, IMPREGNATING AND COATING COMPOSITIONS

[75] Inventors: Anton Hesse, Luetzelsachsen; Peter Lechtken, Frankenthal; Walter Nicolaus, Ludwigshafen; Dankmar Scholz, Frankenthal, all of Fed. Rep. of Germany

[73] Assignee: BASF Aktiengesellschaft, Fed. Rep. of Germany

[21] Appl. No.: 55,359

[22] Filed: Jul. 6, 1979

[51] Int. Cl.³ .................................................. C08F 2/50
[52] U.S. Cl. .................................. 204/159.23; 525/20
[58] Field of Search .................. 204/159.23; 260/936, 260/932, 941, 927 R, 45.8 R; 525/20

[56] References Cited

U.S. PATENT DOCUMENTS

| | | | |
|---|---|---|---|
| 3,012,054 | 12/1961 | Moss | 260/932 |
| 3,331,761 | 7/1967 | Mao | 204/159.23 |
| 3,450,616 | 6/1969 | Eldred | 204/159.23 |
| 3,456,039 | 7/1969 | Beriger et al. | 260/941 |
| 3,619,392 | 11/1971 | Metzner et al. | 204/159.23 |
| 3,627,656 | 12/1971 | Miller | 204/159.23 |
| 3,649,495 | 3/1972 | Rust | 204/159.23 |
| 3,767,547 | 10/1973 | Puhk | 204/159.23 |
| 3,933,682 | 1/1976 | Bean | 204/159.23 |
| 4,017,652 | 4/1977 | Gruber | 204/159.23 |
| 4,116,788 | 9/1978 | Schmitt et al. | 204/159.23 |

*Primary Examiner*—V. P. Hoke
*Attorney, Agent, or Firm*—Keil & Witherspoon

[57] ABSTRACT

Photocurable molding, impregnating and coating compositions based on unsaturated polyester resins containing UV sensitizers, wherein the sensitizers are acylphosphine oxide compounds of the general formula

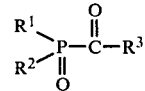

A preferred sensitizer is 2,4,6-trimethylbenzoyldiphenylphosphine oxide which is employed with or without conventional UV sensitizers, preferably benzildimethylketal. The compositions can be cured to give moldings and coatings.

7 Claims, No Drawings

PHOTOCURABLE MOLDING, IMPREGNATING AND COATING COMPOSITIONS

A large number of compounds have been described as sensitizers for the photopolymerization of unsaturated polyester resins (UP resins). Using acyloins, acyloinesters and acyloin-ethers as UV sensitizers, relatively rapid UV curing of UP resins is possible, but after having been cured by high energy radiation (from a high-pressure mercury vapor lamp), the molded materials produced are yellowish. This disadvantageous yellowing, which diminishes when the molded materials are stored in the dark, but increases again when they are stored in daylight or artificial light, manifests itself to an objectionable degree when the compositions are used to coat light-colored wood or to manufacture lighting panels or corrugated sheets.

The yellowing of molded materials produced from UP resins containing a benzoin ether can, it is true, be reduced, according to U.S. Pat. No. 3,669,022, by means of trivalent phosphorus compounds, but cannot be suppressed sufficiently to allow UV curing for the applications mentioned above. The use of benzil ketals, which, it is true, gives storage-stable, very reactive UV-curable UP resins, also offers no improvement as regards a more advantageous color of the molded materials.

It is an object of the present invention to provide a photocurable molding, impregnating and coating composition which, on UV curing, exhibits a substantially higher rate of reaction than in the prior art, coupled with comparable or better color of the resulting molded product.

We have found that this object is achieved by a photocurable molding, impregnating and coating composition comprising a mixture of (a) one or more ethylenically unsaturated copolymerizable polyesters,
(b) one or more ethylenically unsaturated copolymerizable monomeric compounds,
(c) an inhibitor and
(d) a UV sensitizer, with or without paraffins, thermally decomposable initiators, fillers, reinforcing agents, lubricants, inert solvents, shrinkage-reducing additives and/or other assistants usable in unsaturated polyesters, wherein the UV sensitizer consists of one or more acylphosphine oxide compounds of the formula

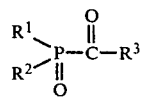
(I)

where $R^1$ is straight-chain or branched alkyl of 1 to 6 carbon atoms, cyclohexyl, cyclopentyl, aryl which is unsubstituted or substituted by halogen, alkyl or alkoxy, or a S-containing or N-containing five-membered or six-membered heterocyclic radical, $R^2$ has one of the meanings of $R^1$ (but $R^1$ and $R^2$ may be identical or different), or is alkoxy of 1 to 6 carbon atoms, aryloxy or araloxy, or $R^1$ and $R^2$ together form a ring, and $R^3$ is straight-chain or branched alkyl of 2 to 18 carbon atoms, a cycloaliphatic radical of 3 to 10 carbon atoms, phenyl, naphthyl or a S-, O- or N-containing five-membered or six-membered heterocyclic radical, and may contain additional substituents, or is the group

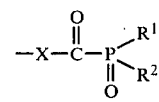

where $R^1$ and $R^2$ have the above meanings and X is phenylene or an aliphatic or cycloalipatic divalent radical of 2 to 6 carbon atoms, and one or more of the radicals $R^1$ to $R^3$ may be olefinically unsaturated.

The molding, impregnating and coating compositions according to the invention are distinguished by high reactivity on irradiation with UV light of relatively long wavelengths, namely from about 300 to 500 nm. They have the advantage, over molding compositions containing acyloin derivatives or benzil ketals as sensitizers, that the cured molded materials exhibit a substantially lower tendency to yellow, and in particular that thick-walled glass fiber-reinforced moldings cure more rapidly. This is particularly advantageous when UV-curing laminates which are produced by the hand lay-up, winding, centrifugal casting or fiber spraying processes.

Similarly advantageous results are also obtained on UV curing of kneadable molding compositions which are free from glass fibers.

Preferred UV sensitizers are those acylphosphine oxide compounds of the formula I where $R^3$ is cycloalkyl, naphthyl or a S-, N- or O-containing five-membered or six-membered heterocyclic radical which contains substituents A and B at least in the two ortho-positions to the carbonyl group, A and B, which are identical or different, being alkyl, cycloalkyl, aryl, alkoxy, thioalkyl, carbalkoxy, cyano or halogen.

The expression "contains substituents A and B in the two ortho-positions to the carbonyl group" means that the substituents A and B are bonded to the two carbon atoms, capable of substitution, which are adjacent to the point of attachment of the carbonyl group. This means, for example, that the α-naphthyl radical contains substituents A and B at least in the 2- and 8-positionings an the β-naphthyl radical at least in the 1- and 3-positions.

Such UV sensitizers, especially the particularly preferred 2,4,6-trimethylbenzoyldiphenylphosphine oxide, surpass in their reactivity all conventional photoinitiators for unsaturated polyester resins. This high reactivity results in a high exothermicity on curing laminates. Hence, the curing can be carried out with lamps of lower energy emission than hitherto. For example, it is possible to dispense with expensive high-pressure mercury vapor lamps and instead to use simpler low-pressure lamps, for example conventional fluorescent tubes.

Further, the preferred highly reactive UV sensitizers substantially improve the shelf life of the sensitized molding, impregnating and coating compositions, so that it is possible to prepare one-component systems which exhibit a constant level of curing activity over the entire period of storage.

The following details may be noted in respect of the starting components (a) to (e) usable for the preparation of the photocurable molding, impregnating and coating compositions:

(a) Unsaturated polyesters for the purposes of the invention are not only the conventional unsaturated polycondensation products of, preferably, dicarboxylic acids and glycols, but also unsaturated polyesters containing urethane groups, and unsaturated vinyl ester resins.

Preferred unsaturated polyesters are the conventional polycondensation products of polybasic, especially dibasic, carboxylic acids and their esterifiable derivatives, especially their anhydrous, linked by ester bonds to polyhydric, especially dihydric, alcohols, which products may in addition contain radicals of monobasic carboxylic acids and/or radicals of monohydric alcohols and/or radicals of hydroxycarboxylic acids, and in which products at least some of the radicals must possess ethylenically unsaturated copolymerizable groups.

Suitable polyhydric, especially dihydric, saturated or unsaturated alcohols are the conventional alkanediols and oxa-alkanediols which in particular contain acylic groups, cyclic groups or both types of groups, for example ethylene glycol, 1,2-propylene glycol, propane-1,3-diol, 1,3-butylene glycol, butene-1,4-diol, hexane-1,6-diol, 2,2-dimethylpropane-1,3-diol, diethylene glycol, triethylene glycol, polyethylene glycol, cyclohexane-1,2-diol, 2,2-bis-(p-hydroxycyclohexyl)-propane, trimethylolpropane monoallyl ether and butene-1,4-diol. Minor amounts of monohydric, trihydric or higher polyhydric alcohols, eg. ethylhexanol, fatty alcohols, benzyl alcohols, 1,2-di-(allyloxy)-propan-3-ol, glycerol, pentaerythritol or trimethylolpropane may also be used as components. The polyhydric, especially dihydric, alcohols are in general reacted in stoichiometric or approximately stoichiometric amounts with polybasic, especially dibasic, carboxylic acids or their condensable derivatives.

Suitable carboxylic acids and their derivatives are dibasic olefinically unsaturated, preferably $\alpha,\beta$-olefinically unsaturated, carboxylic acids, eg. maleic acid, fumaric acid, chloromaleic acid, itaconic acid, citraconic acid, methyleneglutaric acid and mesaconic acid, and their esters or, preferably, their anhydrides. The polyesters may additionally contain, as condensed units, other dibasic carboxylic acids which act as modifiers and may be unsaturated and/or saturated or aromatic, for example succinic acid, glutaric acid, $\alpha$-methylglutaric acid, adipic acid, sebacic acid, pimelic acid, phthalic anhydride, o-phthalic acid, isophthalic acid, terephthalic acid, dihydrophthalic acid, tetrahydrophthalic acid, tetrachlorophthalic acid, 3,6-endomethylene-1,2,3,6-tetrahydrophthalic acid, endomethylenetetrachlorophthalic acid or hexachloroendomethylenetetrahydrophthalic acid, as well as monobasic, tribasic or higher polybasic carboxylic acids, for example ethylhexanoic acid, fatty acids, methacrylic acid, propionic acid, benzoic acid, 1,2,4-benzenetricarboxylic acid or 1,2,4,5-benzenetetracarboxylic acid. The use of maleic acid, maleic anhydride and fumaric acid is preferred. Since the maximum cross-linking capacity of such polyesters is an important factor in the behavior of the low-shrinkage system, the greater part, ie. from 50 to 100%, of the dicarboxylic acids present in the polyester should be unsaturated.

Mixtures of unsaturated polyesters, including those which are of only limited solubility in the vinyl monomers (b) and crystallize readily can also be used with advantage. Such readily crystallizing unsaturated polyesters can be synthesized, for example, from fumaric acid, adipic acid, terephthalic acid, ethylene glycol, butane-1,4-diol, hexane-1,6-diol and neopentylglycol.

Unsaturated polyesters with preferably terminal double bonds are also suitable.

The unsaturated polyesters have acid numbers of from 10 to 200, preferably from 20 to 85, and mean molecular weights of from about 800 to 6,000, preferably from about 1,000 to 4,000.

The amorphous and, in some cases, crystallizable unsaturated polyesters are in general prepared from their starting components by melt condensation of condensation under azeotropic conditions, using continuous or batchwise methods.

Regarding the composition of unsaturated polyesters, reference may for example also be made to the book by H. V. Boenig, Unsaturated Polyesters: Structure and Properties, Amsterdam, 1964.

Instead of unsaturated polyesters it is also possible to use, as already mentioned, unsaturated polyesters containing urethane groups. To obtain these, the above unsaturated polyesters are reacted with organic polyisocyanates, preferably aliphatic, cycloaliphatic and especially aromatic diisocyanates, thereby extending the unsaturated polyester chain and increasing the molecular weight. Examples of compounds suitable for chain extension are aliphatic diisocyanates, eg. 1,4-butane-diisocyanate and 1,6-hexane-diisocyanate, cycloaliphatic diisocyanates, eg. 1,3- and 1,4-cyclohexane-diisocyanate, 1-methyl-2,4- and 2,6-cyclohexane-diisocyanate and the corresponding isomer mixtures, isophorone diisocyanate and 4,4'-, 2,4'- and 2,2'-dicyclohexylmethane-diisocyanate, as well as the corresponding isomer mixtures and, preferably, aromatic diisocyanates, eg. 2,4- and 2,6-toluylene-diisocyanate and the corresponding isomer mixtures, 4,4'-, 2,4'- and 2,2'-diphenylmethane-diisocyanate and the corresponding isomer mixtures, and 1,5-naphthylene-diisocyanate. To prepare the unsaturated polyesters containing urethane groups, the starting materials are advantageously reacted at form 0° to 120° C., preferably from 15° to 60° C., in such amounts that the ratio of Zerewitinoff-active hydrogens, preferably bonded to OH and COOH groups, of the unsaturated polyesters, to NCO groups of the polyisocyanates is from 1:0.1 to 1:0.9, preferably from 1:0.2 to 1:0.7. The resulting unsaturated polyesters containing urethane groups have acid numbers of from 2 to 30, preferably from 5 to 20, and mean molecular weights of from about 1,000 to 10,000, preferably from about 1,500 to 6,000.

Suitable unsaturated vinyl ester resins for the purposes of the invention contain the characteristic group $—CO—OCH_2CHOH—CH_2O—$ and also contain terminal polymerizable unsaturated groups. The vinyl ester resins are prepared by reacting about equivalent amounts of a polyepoxide resin and of an unsaturated monocarboxylic acid, for example reacting 1 equivalent of methacrylic acid with 1 equivalent of a polyepoxide resin.

Vinyl ester resins of the stated type are described, for example, in U.S. Pat. No. 3,367,992, according to which dicarboxylic acid half-esters of hydroxyacrylates or hydroxymethacrylates are reacted with polyepoxide resins. According to U.S. Pat. Nos. 3,066,112 and 3,179,623, vinyl ester resins are obtained from monocarboxylic acids, eg. acrylic acid and methacrylic acid; these patents also disclose an alternative method of preparation, wherein a glycidyl methacrylate or glycidyl acrylate is reacted with the sodium salt of a dihydric phenol, eg. bisphenol A. Vinyl ester resins based on epoxy-novalac resins are described in U.S. Pat. No. 3,301,743. U.S. Pat. No. 3,256,226 discloses vinyl ester resins in which the molecular weight of the polyepoxide is increased by reacting it with a dicarboxylic acid and with acrylic acid. Modified vinyl ester resins are also suitable for the purposes of the present invention, for example those disclosed in U.S. Pat. No. 3,947,422, which contain half-ester groups and are obtained by reacting the second hydroxyl group of the —CO—OCH$_2$.CHOH—CH$_2$—O— structure with a dicarboxylic acid anhydride, eg. maleic anhydride, citraconic anhydride, phthalic anhydride, tetrabromophthalic anhydride and the like.

The photocurable molding, impregnating and coating compositions according to the invention in general contain from 10 to 80% by weight, preferably from 15 to 70% by weight, based on the total weight of components (a) and (b), of an unsaturated polyester, an unsaturated polyester containing urethane groups, or an unsaturated vinyl ester resin, or mixtures of the said components (a).

(b) Suitable copolymerizable, ethylenically unsaturated, monomeric compounds are the allyl and, preferably, vinyl compounds conventionally used for the preparation of unsaturated polyester molding, impregnating and coating compositions, for example styrene, substituted styrenes, eg. p-chlorostyrene or vinyltoluene, esters of acrylic acid and methacrylic acid with alcohols of 1 to 18 carbon atoms, eg. methyl methacrylate, butyl acrylate, ethylhexyl acrylate, hydroxypropyl acrylate, dihydrodicyclopentadienyl acrylate and butanediol diacrylate, acrylamides and methacrylamides, allyl esters, eg. diallyl phthalate, and vinyl esters, eg. vinyl ethylhexanoate, vinyl pivalate and the like. Mixtures of the said olefinically unsaturated monomers are also suitable. Preferred components (b) are styrene, α-methylstyrene, chlorostyrene, vinyltoluene, divinylbnzene and diallyl phthalate. The polyester molding, impregnating and coating compositions in general contain component (b) in an amount of from 20 to 90, preferably from 30 to 85, % by weight, based on the total weight of components (a) and (b).

(c) The photocurable molding, impregnating and coating compositions according to the invention are stabilized with the conventional inhibitors (c). Examples of these are phenolic inhibitors, eg. hydroquinone, substituted hydroquinones, pyrocatechol, tert.-butyl-pyrocatechol and nuclear-substituted pyrocatechol derivatives, quinones, eg. benzoquinone, naphthoquinone and chloranil, nitrobenzenes, eg. m-dinitrobenzene, thiodiphenylamine, N-nitroso compounds, eg. N-nitrosodiphenylamine, salts of N-nitroso-N-cyclohexyl-hydroxylamine, and mixtures of these. Other stabilizers are divalent copper salts, eg. copper naphthenates and copper octate, and quaternary ammonium salts of the formula [NR$^5$R$^6$R$^7$R$^8$]$\oplus$X$^-$, where R$^5$, R$^6$, R$^7$ and R$^8$ are alkyl of 1 to 20 carbon atoms, aryl of 6 to 14 carbon atoms or aralkyl of 7 to 30 carbon atoms and X is halogen, preferably chlorine.

The addition of selected UV absorbers for the purpose of the light stabilization of the cured products in some cases slightly reduces the rate of UV curing, but this reduction is within acceptable limits. Suitable absorbers are those from the hydroxybenzophenone, salicyclic acid ester and hydroxyphenylbenztriazole series.

The inhibitors are in general present in the molding, impregnating and coating compositions in an amount of from 0.005 to 0.5, preferably from 0.01 to 0.2, % by weight based on components (a) and (b).

(d) The UV sensitizers (d) using according to the invention are acylphosphine oxide compounds of the formula

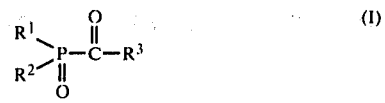

Examples of these are acylphosphine oxides and acylphosphinic acid esters. The following details may be noted with regard to formula (I):

R$^1$ may be straight-chain or branched alkyl of 1 to 6 carbon atoms, eg. methyl, ethyl, i-propyl, n-propyl, n-butyl, amyl or n-hexyl, cycloalkyl, cyclopentyl and cyclohexyl, aryl, eg. phenyl and naphthyl, halogen-substituted aryl, eg. monochlorophenyl and dichlorophenyl, alkyl-substituted phenyl, eg. methylphenyl, ethylphenyl, isopropylphenyl, tert.-butylphenyl and dimethylphenyl, alkoxy-substituted aryl, eg. methoxyphenyl, ethoxyphenyl and dimethoxyphenyl, or a S-containing or N-containing five-membered or six-membered ring, eg. thiophenyl or pyridyl, R$^2$ may have one of the meanings of R$^1$ and may also be alkoxy of 1 to 6 carbon atoms, eg. methoxy, ethoxy, i-propoxy, butoxy or ethoxyethoxy, or aryloxy, eg. phenoxy, methylphenoxy or benzyloxy, and R$^1$ and R$^2$ may be joined to form a ring, as, for example, in acylphosphonic acid o-phenylene esters.

R$^3$ may be for example ethyl, i-propyl, n-propyl, n-butyl, i-butyl, tert.-butyl, i-amyl, n-hexyl, heptyl, n-octyl, 2-ethylhexyl, i-nonyl dimethylheptyl, lauryl, stearyl, cyclopropyl, cyclobutyl, cyclopentyl, 1-methylcyclopentyl, cyclohexyl, 1-methylcyclohexyl, norbornadienyl, adamantyl, phenyl, methylphenyl, tert.-butylphenyl, isopropylphenyl, methoxyphenyl, i-propoxyphenyl, thiomethoxyphenyl, α- and β-naphthyl, thiophenyl, pyridyl, β-acetoxyethyl or β-carboxyethyl.

R$^1$, R$^2$ and R$^3$ may in addition contain carbon-carbon double bonds which allow the UV sensitizer to be incorporated into the binder as copolymerized units.

Examples of the UV sensitizers according to the invention are methyl isobutyryl-methylphosphinate, methyl isobutyryl-phenylphosphinate, methyl pivaloyl-phenylphosphinate, methyl 2-ethylhexanoyl-phenylphosphinate, isopropyl pivaloyl-phenylphosphinate, methyl p-toluyl-phenylphosphinate, methyl o-toluyl-phenylphosphinate, methyl 2,4-dimethylbenzoyl-phenylphosphinate, methyl acryloyl-phenylphosphinate, isobutyryldiphenylphosphine oxide, 2-ethylhexanoyl-diphenylphosphine oxide, o-toluyl-diphenylphosphine oxide, p-tert.-butylbenzoyldiphenylphosphine oxide, 3-pyridylcarbonyl-diphenylphosphine oxide, acryloyldiphenylphosphine oxide, benzoyldiphenylphosphine oxide, vinyl pivaloyl-phenylphosphinate and adipoyl-bis-diphenylphosphine oxide.

The following are preferred: pivaloyl-diphenylphosphine oxide, p-toluyl-diphenylphosphine oxide, 4-(tert.-butyl)-benzoyl-diphenylphosphine oxide, terephthaloyl-bis-diphenylphosphine oxide, 2-methylbenzoyl-diphenylphosphine oxide, versatoyl-diphenylphosphine oxide, 2-methyl-2-ethylhexanoyl-diphenylphosphine oxide, 1-methyl-cyclohexanoyldiphenylphosphine oxide, methyl pivaloyl-phenylphosphinate and isopropyl pivaloyl-phenylphosphinate.

These compounds may be prepared by reacting an acid halide of the formula

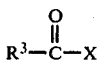

where X is Cl or Br, with a phosphite of the formula

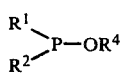

where $R^4$ is straight-chain or branched alkyl of 1 to 6 carbon atoms, or cycloalkyl of 5 or 6 carbon atoms.

The reaction can be carried out in a solvent, for example a hydrocarbon or hydrocarbon mixture, eg. petroleum ether, toluene, cyclohexane, an ether or some other conventional inert organic solvent, or even without a solvent, at from −30° C. to +110° C., preferably at from 10° to 70° C. The product can be directly crystallized out from the solvent, or remains after evaporation, or is distilled under reduced pressure.

The acid halide

and the substituted phosphine $R^1R^2POR^4$ are obtained by processes known to those skilled in the art from the literature (for example K. Sasse in Houben-Weyl, Volume 21/1, pages 208-209, G. Thieme-Verlag, Stuttgart).

The process for the preparation of the compounds according to the invention can for example be represented by the following equation:

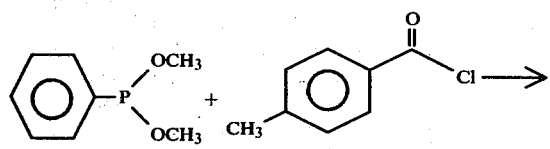

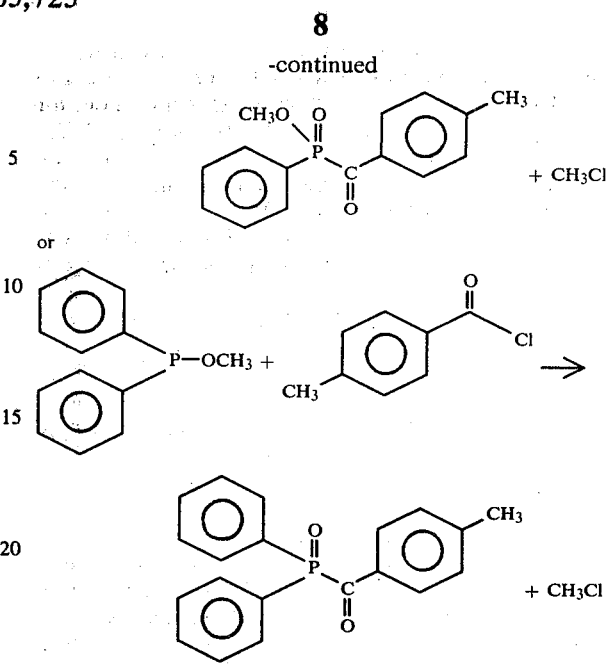

Examples of suitable phosphines are methyldimethoxyphosphine, butyldimethoxyphosphine, phenyldimethoxyphosphine, toluyldimethoxyphosphine, phenyldiethoxyphosphine, toluyldiethoxyphosphine, phenyldiisopropoxyphosphine, tolyldiisopropoxyphosphine, phenyldibutoxyphosphine, tolyldibutoxyphosphine and dimethylmethoxyphosphine, dibutylmethoxyphosphine, dimethylbutoxyphosphine, diphenylmethoxyphosphine, diphenylethoxyphosphine, diphenylpropoxyphosphine, diphenylisopropoxyphosphine, diphenylbutoxyphosphine and similar starting materials which lead to the compounds according to the invention.

Suitable acid halides are the chlorides and bromides, of which the former are particularly preferred.

Specific examples of the compounds according to the invention (without this list implying any restriction) are:

TABLE 1

Examples of compounds according to the invention (Ph = phenyl)

| Compound | M.p. | B.p. | Yield | | Analysis | | |
|---|---|---|---|---|---|---|---|
| | | | | | C | H | P |
| (CH₃)₃C—C(O)—P(Ph)(OCH₃)(=O) with CH₃ groups | — | 104/0.3 | 65% | calc. | 60.0 | 7.08 | 12.9 |
| | | | | found | 59.8 | 6.19 | 12.4 |
| branched alkyl-CH(CH₂CH₃)-C(O)-P(Ph)(OCH₃)(=O) | — | 164/1.2 | 65% | calc. | 64.06 | 7.83 | 11.03 |
| | | | | found | 63.8 | 8.1 | 11.0 |
| 4-CH₃-C₆H₄-C(O)-P(Ph)(OCH₃)(=O) | 101 | — | 70% | calc. | 65.69 | 5.47 | 11.31 |
| | | | | found | 65.7 | 5.6 | 11.0 |
| 4-CH₃-C₆H₄-C(O)-P(Ph)₂(=O) | 105 | — | 73% | calc. | 75.00 | 5.31 | 9.69 |
| | | | | found | 75.30 | 5.8 | 9.3 |

TABLE 1-continued

Examples of compounds according to the invention (Ph = phenyl)

| Compound | M.p. | B.p. | Yield | | C | H | P |
|---|---|---|---|---|---|---|---|
| (2-methylphenyl)-C(O)-P(O)(Ph)₂ | 107 | — | 84% | calc. | 75.00 | 5.31 | 9.69 |
| | | | | found | 74.7 | 5.4 | 9.5 |
| (CH₃)₃C-(4-C₆H₄)-C(O)-P(O)(Ph)₂ | 136 | — | 83% | calc. | 76.24 | 6.35 | 8.56 |
| | | | | found | 76.0 | 6.5 | 8.7 |
| Ph₂P(O)-C(O)-(C₆H₄)-C(O)-P(O)Ph₂ | 205 | — | 35% | calc. | 71.91 | 4.49 | 11.61 |
| | | | | found | 71.8 | 4.8 | 11.0 |
| (CH₃)₂C(OCH₃)-C(O)-PPH₂ | 114 | — | 81% | calc. | 71.33 | 6.64 | 10.84 |
| | | | | found | 71.0 | 6.5 | 11.0 |
| (CH₃)₂C(OCH₃)-C(O)-P(O)(Ph)(O-CH(CH₃)₂) | — | 120/0.5 | 60% | calc. | 62.68 | 7.84 | 11.57 |
| | | | | found | 63.0 | 8.0 | 11.4 |
| CH₃-CH₂-CH₂-CH₂-C(CH₃)(CH₃)-C(O)-P(O)Ph₂ | — | — | 90% | calc. | 73.68 | 7.89 | 9.06 |
| | | | | found | 73.6 | 8.1 | 8.6 |
| CH₃-C(O)-O-CH₂-C(CH₃)₂-C(O)-P(O)Ph₂ | — | — | 90% | calc. | 66.28 | 6.11 | 9.01 |
| | | | | found | 65.9 | 6.1 | 8.6 |
| (CH₃)₂C(OCH₃)-C(O)-P(O)(CH₃)(O-CH(CH₃)₂) | — | 51/0.3 | 80% | calc. | 52.43 | 9.22 | 15.05 |
| | | | | found | 52.1 | 9.1 | 14.9 |
| (1-naphthyl)-C(O)-P(O)Ph₂ | 166 | — | 65% | calc. | 77.52 | 4.78 | 8.71 |
| | | | | found | 77.7 | 4.8 | 8.4 |
| (4-methylphenyl)-C(O)-P(O)(CH₃)(OC₂H₅) | — | 102/0.05 | 60% | calc. | 58.41 | 6.64 | 13.71 |
| | | | | found | 58.9 | 6.7 | 13.5 |
| (2-methylcyclohexyl)-C(O)-P(O)Ph₂ | 80 | — | 26% | calc. | 73.62 | 7.06 | 9.51 |
| | | | | found | 73.3 | 7.1 | 9.6 |
| CH₃-CH₂-CH₂-CH₂-C(CH₃)(CH₂CH₃)-C(O)-P(O)Ph₂ | — | — | 90% | calc. | 73.68 | 7.89 | 9.06 |
| | | | | found | 73.9 | 8.1 | 9.4 |

Particularly suitable UV sensitizers for unsaturated polyester resins are acyl-phenyl-phosphinic acid esters and acyl-diphenyl-phosphine oxides where acyl is derived from a secondary-substituted or tertiary-substituted aliphatic carboxylic acid, eg. pivalic acid, 1-methylcyclohexanecarboxylic acid, norbornenecarboxylic acid, a mixture of α,α-dimethylalkanecarboxylic acids (Versatic$^{(R)}$ acid of 9 to 13 carbon atoms) or 2-ethylhexanecarboxylic acid, or from a substituted aromatic carboxylic acid, eg. p-methylbenzoic acid, o-methylbenzoic acid, 2,4-dimethylbenzoic acid, p-tert.-butylbenzoic acid, 2,4,5-trimethylbenzoic acid, p-methoxybenzoic acid or p-thiomethylbenzoic acid.

Particularly preferred highly reactive UV sensitizers are those of the general formula I, where $R^3$ is cycloalkyl, phenyl, naphthyl or a S-, N- or O-containing five-membered or six-membered heterocyclic radical, eg. furyl, pyrrolyl, thienyl, pyranyl or pyridyl, which contains the substituents A and B at least in the two positions ortho to the carbonyl group, A and B being identical or different and each being linear or branched alkyl of 1 to 6, preferably 1 to 4, carbon atoms, eg. methyl, ethyl, propyl, iso-propyl, butyl, isobutyl or tert.-butyl; unsubstituted or substituted cycloalkyl, for example cyclohexyl, unsubstituted or substituted aryl, for example phenyl or toluyl, alkoxy or thioalkyl of 1 to 6, preferably 1 to 4, carbon atoms, eg. methoxy, ethoxy, propoxy, iso-propoxy, n-butoxy, methylthio, ethylthio, propylthio, iso-propylthio, n-butylthio, sec.-butylthio or tert.-butylthio; carbalkoxy of 1 to 6, preferably of 1 to 4, carbon atoms in the alcohol radical, eg. carbomethoxy, carboethoxy, carbopropoxy, carboisopropoxy, carbobutoxy or carbo-sec.-butoxy, cyano or halogen, for example chlorine, bromine or iodine.

The acylphosphine oxide compounds containing $R^3$ may for example be represented by the following structural formulae

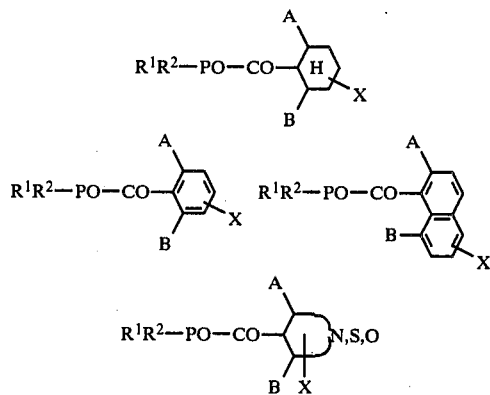

where X represents optional additional substituents in the cycloalkyl, aryl, naphthyl or heterocyclic radicals and has one of the meanings given for A or B.

Examples of such highly reactive UV sensitizers are methyl 2,6-dimethylbenzoyl-phenylphosphinate, methyl 2,6-dimethoxybenzoyl-phenylphosphinate, 2,6-dimethylbenzoyl-diphenylphosphine oxide, 2,6-dimethoxybenzoyl-diphenylphosphine oxide, methyl 2,4,6-trimethylbenzoyl-phenylphosphinate, 2,4,6-trimethylbenzoyl-diphenylphosphine oxide, 2,3,6-trimethylbenzoyl-diphenylphosphine oxide, methyl 2,4,6-trimethylbenzoyl-tolylphosphinate, 2,4,6-trimethoxybenzoyl-diphenylphosphine oxide, ethyl 2,6-dichlorobenzoyl-phenylphosphinate, 2,6-dichlorobenzoyl-diphenylphosphine oxide, 2-chloro-6-methylthio-benzoyl-diphenylphosphine oxide, 2,6-dimethylthio-benzoyl-diphenylphosphine oxide, 2,3,4,6-tetramethylbenzoyl-diphenylphosphine oxide, 2-phenyl-6-methylbenzoyl-diphenylphosphine oxide, 2,6-dibromobenzoyl-diphenylphosphine oxide, ethyl 2,4,6-trimethylbenzoyl-naphthylphosphinate, ethyl 2,6-dichlorobenzoyl-naphthylphosphinate, 1,3-dimethylnaphthalene-2-carbonyl-diphenylphosphine oxide, 2,8-dimethylnaphthalene-1-carbonyl-diphenylphosphine oxide, 1,3-dimethoxynaphthalene-2-carbonyl-diphenylphosphine oxide, 1,3-dichloronaphthalene-2-carbonyl-diphenylphosphine oxide, 2,4,6-trimethylpyridine-3-carbonyl-diphenylphosphine oxide, 2,4-dimethylquinoline-3-carbonyldiphenylphosphine oxide, 2,4-dimethylfuran-3-carbonyl-diphenylphosphine oxide, 2,4-dimethoxyfuran-3-carbonyl-diphenylphosphine oxide, methyl 2,4,5-trimethyl-thiophene-3-carbonyl-phenylphosphinate and 2,4,5-trimethyl-thiophene-3-carbonyl-diphenylphosphine oxide.

The use of the following is preferred: 2,4,6-trimethylbenzoyl-diphenylphosphine oxide, 2,6-dimethoxybenzoyl-diphenylphosphine oxide, 2,6-dichlorobenzoyl-diphenylphosphine oxide, 2,3,5,6-tetramethyl-benzoyl-diphenylphosphine oxide and methyl 2,4,6-trimethylbenzoyl-phenylphosphinate.

Particularly preferred highly reactive UV sensitizers are acylphenylphosphinic acid esters and acyldiphenylphosphine oxides, where acyl is derived from a di-ortho-substituted aromatic carboxylic acid, eg. 2,4,6-trimethylbenzoic acid, 2,6-dimethoxybenzoic acid, 2,6-dichlorobenzoic acid or 2,3,5,6-tetramethylbenzoic acid.

The acylphosphine oxide compounds usable according to the invention are employed in amounts of from 0.005 to 5% by weight, preferably from 0.01 to 3% by weight, based on the weight of the unsaturated polyesters (a) and ethylenically unsaturated monomeric compounds (b).

(e) Examples of polyester or vinyl ester resin additives which fall under this heading are reinforcing agents, lubricants, inert solvents, shrinkage-reducing additives and/or other assistants usable with unsaturated polyester compositions.

Paraffins which are used in the photocurable molding, impregnating and coating compositions according to the invention have melting points of from 25° to 90° C., preferably from 45° to 60° C. A paraffin having a melting point of from 46° to 48° C. has proved very suitable and is therefore especially preferred.

Instead of the paraffins, other waxy materials, for example the paraffin oxidation products known as montan wax, and their esters, carnauba wax, long-chain fatty acids, eg. stearic acid, stearyl stearate, ceresine and the like may also be employed.

To reduce monomer evaporation and form a non-tacky surface, the unsaturated molding compositions contain from 0.01 to 5% by weight, preferably from 0.05 to 1% by weight, especially from 0.1 to 0.5% by weight, based on the total weight of components (a) and (b), of a paraffin.

Examples of suitable thickeners are those based on alkaline earth metal oxides and hydroxides, eg. calcium oxide, calcium hydroxide, magnesium hydroxide and, preferably, magnesium oxide, and mixtures of these oxides and/or hydroxides. These compounds may also be partly replaced by zinc oxide.

The content of thickeners in the polyester and vinyl ester molding compositions according to the invention is in general from 0.5 to 5, preferably from 1 to 3, % by weight, based on the mixture of components (a) and (b).

Examples of initiators which may be used additionally to the acylphosphine oxide compounds according to the invention are peroxides, for example per-esters, eg. tert.-butyl peroctoate and tert.-butyl perpivalate, percarbonates, eg. bis-(4-tert.-butylcyclohexyl) peroxydicarbonate, diacyl peroxides, eg. benzoyl peroxide, dialkyl peroxides, eg. ditert.-butyl peroxide and dicumyl peroxide, hydroperoxides, eg. cyclohexanone peroxide, methyl ethyl ketone peroxide, cumene hydroperoxide and tert.-butyl hydroperoxide, which may or may not be used in combination with metal accelerators, eg. cobalt-II salts of ethylhexanoic acid or of naphthenic acid, azo compounds, eg. azo-diisobutyrodinitrile, tetraphenyl-ethanediol and/or $\alpha,\alpha,\alpha',\alpha'$-tetrasubstituted dibenzyl compounds, as described, for example, in Kunststoffe 66 (1976), 693. Thick laminate structures comprising glass fibers and quartz sand, e.g. for pipes, can be advantageously cured by UV radiation if, in addition to the acylphosphine oxide compounds according to the invention, thermally decomposing initiators are used in small amounts, for example from 0.05 to 1% by weight, preferably from 0.1 to 0.3% by weight, based on the total weight of components (a) and (b). These initiators are decomposed by the heat generated during photopolymerization to give free radicals, so that curing can also take place in deeper layers, which the UV light reaches insufficiently.

It is also particularly advantageous to use photoinitiator combinations of the acylphosphine oxide compounds according to the invention with conventional photoinitiators, for example aromatic ketones, eg. benzil ketals, such as benzil dimethylketal, benzoin ethers and esters, eg. benzoin isopropyl ether, α-hydroxyisobutyrophenone, diethoxyacetophenone or p-tert.-butyltrichloroacetophenone, aromatic disulfides and naphthalenesulfonyl chlorides. Using the said photoinitiator combinations it is possible, in many cases, to achieve, for comparable exposure times, lower residual styrene contents of UP resin molding materials than are achieved with the acylphosphine oxide compounds alone, though the curing activity (as measured by the temperature rise of the resin sample during exposure) is diminished. The photoinitiator combinations advantageously contain from 15 to 85% by weight, preferably from 25 to 75% by weight, of acylphosphine oxide compounds and from 15 to 85% by weight, preferably from 25 to 75% by weight, of an aromatic ketone, an aromatic disulfide and/or a naphthalene-sulfonyl chloride, the percentages by weight being based on the total weight of the mixture of initiators. The combinations are employed in amounts of from 0.005 to 7% by weight, preferably from 0.01 to 4% by weight, based on the weight of components (a) plus (b).

Furthermore, conventional fillers, reinforcing agents, lubricants, inert solvents, shrinkage-reducing additives and, possibly, other assistants are in most cases added to the curable unsaturated molding, impregnating and coating compositions according to the invention.

Examples of suitable fillers are conventional finely pulverulent or granular inorganic and organic fillers which transmit UV light of relatively long wavelengths, for example hydrated alumina, quartz sand, finely divided silica, asbestos, talc, barium sulfate, gypsum (calcium sulfate) and mica.

Suitable reinforcing agents are inorganic and organic fibers and sheet-like structures thereof (which may or may not be woven), such as mats, for example consisting of glass, asbestos, cellulose and synthetic organic high molecular weight polymers, eg. nylon, polyacrylonitrile and polyesters, for example terephthalates.

The fillers and reinforcing agents can be used in amounts of from 5 to 200% by weight, preferably from 10 to 70% by weight, based on the total weight of components (a) and (b). In many cases, it is advantageous to use a combination of pulverulent and fibrous fillers; for example, this is so for the manufacture of containers. After the laminating process, the laminate can be covered with a plastics film which transmits UV radiation and can then be cured within a very short time with high-pressure mercury vapor lamps (HOK 6, 80 W/cm, Philips) or over a longer period with low-energy UV radiation from fluorescent tubes (eg. TAK 40 W/05, Philips).

Examples of suitable lubricants are zinc stearate, magnesium stearate and calcium stearate, and polyalkylene ether waxes.

Suitable inert solvents which may or may not be used in addition are ketones, esters and hydrocarbons, in amounts of up to 100% by weight, based on component (a). Examples of shrinkage-reducing additives which may or may not be used additionally are thermoplastic polymers, eg. polystyrene, styrene copolymers, polyvinyl acetate, polyacrylates and polymethacrylates, in amounts of from 1 to about 30% by weight, based on components (a)+(b).

Examples of radiation sources for curing the molding, impregnating and coating compositions are fluorescent tubes, high pressure mercury vapor lamps and direct sunlight.

The molding, impregnating and coating compositions according to the invention can be used in many fields of industry. For example, they may be employed for the following purposes.

1. Finishing-coat resins

The finishing coats, which are only about 0.5 mm thick, serve to protect the laminate behind them, which contains hydrolysis-sensitive glass fibers. These resins must conform to high standards in respect of curing activity, and the molded materials must not show more than slight yellowing. The transparent finishing coats are applied to a mold by spraying or brushing and are then surface-gelled or cured by UV radiation, after which the molding composition containing glass fibers is applied thereto.

2. Fiber-reinforced molding materials (a) Lighting panels

Such panels, used in the building trade, are distinguished by high transparency and a low degree of yellowing. Continuously-operating machines are employed for the manufacture of flat, lengthwise-corrugated or crosswise-corrugated lighting panels. Glass fiber mats are impregnated with the light-stabilized UP resins between cover films, deaerated and finally solidified by cold curing. Using the acylphosphine oxide initiators according to the invention, the curing can also be effected by using UV radiation from high pressure mercury vapor lamps (literature on the manufacture of lighting panels: P. H. Selden "Glasfaserverstärkte Kunststoffe", Springer-Verlag Berlin-Heidelberg-New York, 1967, page 610).

(b) Batchwise processes for the manufacture of fiber-reinforced, especially glass fiber-reinforced, molded materials suitable for UV curing are the hand lay-up process, fiber spraying process, centrifugal casting process and winding process (descriptions being given in P. H. Selden "Glasfaserverstärkte Kunststoffe").

Articles which may be manufactured by these processes include, for example, boats, container panels (chipboard or blockboard panels coated on both sides with glass fiber-reinforced plastic), pipes and vessels.

(c) UP resin finishing coats for glass fiber-reinforced molding materials (GRP) and paper laminates.

The surface quality of GRP articles and paper laminates can be improved substantially by applying a finishing coat. The following advantages can be achieved.

1. GRP laminates, for example corrugated sheets:

(a) Longer retention of gloss on outdoor exposure, and hence less soiling.

(b) Less loss of transparency on outdoor exposure, as a result of the glass-resin interface being protected.

2. Paper laminates based on unsaturated polyester resins, urea resins or melamine resins:
(a) Increase in surface gloss.
(b) Surfaces are less sensitive to handling than melamine resin surfaces.
(c) The high transparency of the UP finishing coat gives the same visual impression as with a surface coated with a clear varnish.

The finishing coat itself must be produced on a support (for example a film) before the laminate is produced. This is done by applying a 20-200 μm thick UP resin layer to a release film, and then curing it with UV. The final curing of this layer takes place subsequently, when the laminate itself is cured.

Producing the finishing coat by conventional methods has the following disadvantages:
(a) If curing is carried out with organic peroxides at elevated temperatures, there is a substantial loss of styrene, and therefore a danger of undercuring.
(b) If curing is carried out with a peroxide and an accelerator at elevated temperatures, the loss of styrene can admittedly be reduced, but disadvantages found are the lower pot life (from 30 to 60 minutes) and the intrinsic color of the molded material, resulting from the presence of the accelerator (a Co salt).
(c) UV curing with conventional photoinitiators gives yellowish finishing coats; the yellowing becomes aggravated on outdoor exposure.

Using the molding compositions according to the invention, the above shortcomings of the other processes are not encountered. Instead, rapid curing with UV light gives virtually colorless finishing coats which do not yellow either in daylight or in artificial light.

3. Potting

The novel sensitizers are exceptionally suitable for use in casting resins for potting of, for example, electronic components. When potting opaque objects, it is necessary to ensure uniform illumination from all sides.

In the Examples, parts and percentages are by weight, unless stated otherwise. Parts by volume bear the same relation to parts by weight as the liter to the kilogram.

The Examples and Comparative Examples were carried out with the following unsaturated polyester resins:

Resin A is a 65% strength solution, stabilized with 0.01% of hydroquinone, of an unsaturated polyester, obtained from maleic acid, o-phthalic acid, ethylene glycol and 1,2-propylene glycol in the molar ratio of 1:2:2.4:0.70 in styrene. The unsaturated polyester has an acid number of 50.

Resin B is a 67% strength solution, stabilized with 0.01% of hydroquinone, of an unsaturated polyester, obtained from maleic acid, tetrahydrophthalic acid and diethylene glycol in the molar ratio of 1:0.5:1.5 in styrene. The unsaturated polyester has an acid number of 43.

Resin C is a 66% strength solution, stabilized with 0.01% of hydroquinone, of an unsaturated polyester, obtained from maleic acid, o-phthalic acid and 1,2-propylene glycol in the molar ratio of 1:0.5:1.5 in styrene. The unsaturated polyester has an acid number of 50.

Resin D is a 65% strength solution, stabilized with 0.01% of hydroquinone, of an unsaturated polyester, obtained from maleic acid, isophthalic acid, 1,2-propylene glycol and diethylene glycol in the molar ratio of 1:0.67:0.72:1 in styrene. The unsaturated polyester has an acid number of 26.

Resin E is a 65% strength solution, stabilized with 0.01% of hydroquinone, of an unsaturated polyester, obtained from fumaric acid, adipic acid, neopentylglycol and 1,2-propylene glycol in the molar ratio of 1:1:1.7:0.35 in styrene. The unsaturated polyester has an acid number of 17.

Resin F is a mixture of 55% of resin A and 45% of a 67% strength solution, stabilized with 0.01% of hydroquinone, of an unsaturated polyester, obtained from maleic acid, adipic acid, 1,2-propylene glycol and diethylene glycol in the molar ratio of 1:0.5:0.55:1, in styrene, which polyester has an acid number of 30.

Resin G is a 65% strength solution, stabilized with 0.012% of hydroquinone, of an unsaturated polyester, obtained from maleic acid, o-phthalic acid, 1,2-propylene glycol and diethylene glycol in the molar ratio of 1:0.25:1:0.25 in styrene. The unsaturated polyester has an acid number of 43.

Resin H is a 65% strength solution, stabilized with 0.01% of hydroquinone, of an unsaturated polyester, obtained from maleic acid, o-phthalic acid and 1,2-propylene glycol in the molar ratio of 1:1:2 in styrene. The unsaturated polyester has an acid number of 52.

Resin J is a 65% strength solution, stabilized with 0.01% of hydroquinone, of an unsaturated polyester, obtained from maleic acid, o-phthalic acid and 1,2-propylene glycol in the molar ratio of 1:2:3 in styrene. The unsaturated polyester has an acid number of 30.

Resin K is a commercial vinyl ester resin (Derakane 411-45 (a registered trademark) of Dow Chemical Co., Midland, Mich. USA).

The following prior art compounds were employed as UV sensitizers for the Comparative Examples:
I Benzil dimethyl ketal
II Benzoin methyl ether
III Benzoin isopropyl ether
IV Methylolbenzoin methyl ether.

The Examples according to the invention were carried out with the following acylphosphine oxides and acylphosphinic acid esters:
X Pivaloyl-diphenylphosphine oxide
XI p-Toluyl-diphenylphosphine oxide
XII 4-(tert.-butyl)-benzoyl-diphenylphosphine oxide
XIII Terephthaloyl-bis-diphenylphosphine oxide
XIV 2-Methylbenzoyl-diphenylphosphine oxide
XV Versatoyl-diphenylphosphine oxide
XVI 2-Methyl-2-ethylhexanoyl-diphenylphosphine oxide
XVII 1-Methyl-cyclohexanoyl-diphenylphosphine oxide
XVIII Methyl pivaloyl-phenylphosphinate
XIX Isopropyl pivaloyl-phenylphosphinate The following acylphosphine oxides were employed as highly active UV sensitizers:
XX 2,4,6-Trimethylbenzoyl-diphenylphosphine oxide
XXI 2,6-Dimethoxybenzoyl-diphenylphosphine oxide
XXII 2,6-Dichlorobenzoyl-diphenylphosphine oxide
XXIII 2,3,5,6-Tetramethylbenzoyl-diphenylphosphine oxide
XXIV Methyl 2,4,6-trimethylbenzoyl-phenylphosphinate.

The acylphosphine oxide compounds used according to the invention were prepared as follows:
Pivaloyl-diphenylphosphine oxide X 225 parts of diphenylchlorophosphine, dissolved in 220 parts by volume of petroleum ether, are added to a mixture of 1,350 parts by volume of petroleum ether (boiling range 40°-70° C.), 180 parts by volume of N,N- diethylaniline and 67 parts by volume of methanol at 0° C., whilst stirring. The mixture is then stirred for a further 2 hours at room temperature. After cooling the mixture to about +5° C., the amine hydrochloride which has separated out is filtered off and the filtrate is first distilled at 10-20 mm Hg, to remove all low-boiling material. The methoxy-diphenylphosphine is then fractionally distilled at 0.1-1 mm Hg. Boiling point 120°-124° C./0.5 mm Hg. Yield: 175 parts (80%, based on diphenylchlorophosphine).

64.8 parts of methoxy-diphenylphosphine are added dropwise to 36.2 parts of pivaloyl chloride at 30°-60° C., whilst stirring. After completion of the addition, the reaction is allowed to continue for 30 minutes, the mixture is then cooled to 0°-10° C., and the product which has precipitated is recrystallized from cyclohexane.

Yield: 69.5 parts of pivaloyldiphenylphospine oxide (81% of theory).

Melting point 110°-112° C. NMR (CDCl$_3$, δ): 1.33 (s), 7.4–8.0 (m).

Analysis C$_{17}$H$_{19}$O$_3$P (286) calculated: C, 71.33 H 6.64 P 10.84. found: C 70.0 H 6.5 P 11.0.

p-Toluyl-diphenylphosphine oxide XI 108 parts of methoxydiphenylphosphine (as described above), dissolved in 200 parts by volume of toluene, are added to 77 parts of toluic acid chloride. The mixture is then heated for 60 minutes at 50° C., after which it is cooled and the precipitate of toluyldiphenylphosphine oxide is filtered off and recrystallized from cyclohexane.

Yield 117 parts (73% of theory). Melting point 105° C.

NMR (CDCl$_3$, δ): 2.35 (s), 7.2–8 (m).

Analysis C$_{20}$H$_{17}$O$_2$P (320) calculated: C 75.00 H 5.31 P 9.69. found: C 75.3 H 5.8 P 9.3.

4-(tert.-butyl)-benzoyl-diphenylphosphine oxide XII 41.3 parts of p-tert.-butylbenzoyl chloride are reacted with 45.4 parts of methoxydiphenylphosphine, dissolved in 20 parts of toluene, in 90 minutes at 50° C., by a method similar to that described for compound X. After evaporating off the solvent on a rotary evaporator, the product is recrystallized from cyclohexane.

Yield: 63 parts (83% of theory). Melting point 136° C.

NMR (CDCl$_3$, δ): 1.3 (s); 7.3–8.1 (m); 8.5 (d).

Analysis C$_{23}$H$_{23}$O$_2$P (362) calculated: C 76.24 H 6.35 P 8.56. found: C 76.0 H 6.5 P 8.7.

Terephthaloyl-bis-diphenylphosphine oxide XIII 46 parts of terephthaloyl-bis-diphenylphosphine oxide are prepared from 52 parts of terephthalic acid dichloride, dissolved in 200 parts of toluene, and 108 parts of methoxydiphenylphosphine, by a method similar to that described for compound XI. Yield 35% of theory. Melting point 205° C.

NMR (CDCl$_3$, δ): 6.8–8.2 (m).

Analysis C$_{32}$H$_{24}$O$_4$P$_2$ (534) calculated: C 71.91 H 4.49 P 11.61. found: C 71.8 H 4.8 P 11.0.

2-Methylbenzoyl-diphenylphosphine oxide XIV 134 parts of 2-methylbenzoyl-diphenylphosphine oxide are prepared from 77 parts of 2-methyl-benzoyl chloride and 108 parts of methoxydiphenylphosphine by a method similar to that described for compound XI. Yield 84% of theory.

Melting point 107° C.

NMR (CDCl$_3$, δ): 2.5 (s); 7.2–8 (m); 8.8 (m).

Analysis C$_{20}$H$_{17}$O$_2$P (320) calculated C 75.00 H 5.31 P 9.69. found C 74.7 H 5.4 P 9.5.

Versatoyl-diphenylphosphine oxide XV

Using a method similar to that described for compound X, 43.2 parts of methoxydiphenylphosphine are added dropwise, at 50° C., to 35.3 parts of 2,2-dimethyl-heptanecarboxylic acid chloride (Versatic ® acid chloride). The mixture is stirred for 3 hours at 50° C., then cooled to 15° C. and stirred into a slurry of 60 g of silica gel in 350 ml of toluene; stirring is then continued for one hour whilst cooling with ice. The mixture is then filtered and the solvent is distilled off under reduced pressure. Versatoyl-diphenylphosphine oxide remains as a viscous oil.

Yield: 62 parts (90% of theory).

NMR (CDCl$_3$, δ): 0.4–2.3 (m); 7.2–8.1 (m).

Analysis C$_{21}$H$_{27}$O$_2$P (342) calculated: C 73.68 H 7.89 P 9.06. found: C 73.6 H 8.1 P 8.6.

2-Methyl-2-ethylhexanoyl-diphenylphosphine oxide XVI 165 parts of 2-methyl-3-ethyl-hexanoyl-diphenylphosphine oxide are obtained, as an oil crude product, from 88 parts of 2-methyl-2-ethylhexanoic acid chloride and 108 parts of methoxydiphenylphosphine, by a method similar to that described for compound X. Column chromatography over Silica gel 60 (migrating agent: a 3:1 toluene/ether mixture) gives the product as a pale yellowish oil. Yield: 154 parts (90% of theory).

NMR (CDCl$_3$, δ): 1.2 (s); 0.5–2.2 (m); 7.3–8.1 (m).

Analysis C$_{21}$H$_{27}$O$_2$P (342) calculated: C 73.68 H 7.89 P 9.06. found: C 73.9 H 8.1 P 9.4.

1-Methyl-cyclohexanoyl-diphenylphosphine oxide XVII

Using a method similar to that described for compound XI, 80 parts of 1-methyl-1-cyclohexanecarboxylic acid chloride and 108 parts of methoxydiphenylphosphine, in the absence of a solvent, give 100 parts of 1-methyl-cyclohexanoyldiphenylphosphine oxide as an oily crude product, which is purified by chromatography over silica gel (using toluene as the migrating agent).

Yield: 42 parts (26% of theory). Melting point 80° C.

NMR (CDCl$_3$, δ): 14 (s); 1.1–1.6 (m); 2.1–2.4 (m); 7.3–8.0 (m).

Analysis C$_{20}$H$_{23}$O$_2$P (326) calculated: C 73.62 H 7.06 P 9.51. found: C 73.3 H 7.1 P 9.6.

Methyl pivaloyl-phenylphosphinate XVIII 214 parts of phenyldichlorophosphine are added to a mixture of 1,000 parts by volume of toluene, 421 parts by volume of N,N-diethylaniline and 100 parts by volume of methanol at 0° C. The mixture is then stirred for 1 hour at room temperature, the amine hydrochloride precipitate is filtered off and the filtrate is fractionated. Dimethoxyphenylphosphine distils at 46°-50° C./0.2-0.3 mm Hg.

Yield: 190 parts (93% of theory).

110.5 parts of dimethoxyphenylphosphine are added dropwise at 15° C. to 78.7 parts of pivaloyl chloride. The reaction mixture is then heated for 30 minutes at 50° C., after which it is distilled. Methyl pivaloyl-phenylphosphinate passes over at 104°-107° C./0.3 mm Hg.

Yield: 101.3 parts (65% of theory).

NMR (CDCl$_3$, δ): 1.3 (s); 3.75 (d); 7.4–8 (m).

Isopropyl pivaloyl-phenylphosphinate XIX 143 parts of phenyldichlorophosphine are added dropwise in the course of one hour to a mixture of 600 parts by volume of petroleum ether, 263 parts of N,N-diethylaniline and 120 parts of isopropanol at 0° C. The mixture is then stirred for 1 hour at room temperature, worked up as described in Example 1 and distilled.

Diisopropoxy-phenylphosphine distils at 68°–72° C./0.3 mm Hg. Yield: 126 parts (69% of theory).

158 parts of diisopropoxyphenylphosphine are added slowly to 84 parts of pivaloyl chloride at 50°–60° C., with thorough stirring. Stirring is then continued for two hours, after which the mixture is fractionated under reduced pressure. Isopropyl pivaloyl-phenylphosphinate distils at 119°–121° C./0.5 mm.

Yield: 112 parts (60% of theory).

NMR (CDCl$_3$, $\delta$) 125 (s); 1.33 (t); 4.5 (m); 7.3–8 (m).
Analysis: C$_{14}$H$_{21}$O$_3$P (268) calculated: C 62.68 H 7.84 P 11.57. found: C 63.0 H 8.0 P 11.4.

2,4,6-Trimethylbenzoyl-diphenylphosphine oxide XX 648 parts of methoxydiphenylphosphine are added slowly to 547.5 parts of 2,4,6-trimethylbenzoyl chloride at 50°–55° C. in a stirred apparatus equipped with a reflux condenser and dropping funnel. Stirring is continued for 4–5 hours at 50° C., the contents of the flask are dissolved in ether at 30° C., and petroleum ether is added until the mixture begins to turn cloudy. On cooling, 910 parts (87% of theory) of 2,4,6-trimethylbenzoyl-diphenylphosphine oxide crystallize. Melting point: 80°–81° C. The product is in the form of pale yellow crystals.

2,6-Dimethoxybenzoyl-diphenylphosphine oxide XXI 20 parts of 2,6-dimethoxybenzoyl chloride are suspended in 20 parts by volume of toluene in the same apparatus as described for the preparation of initiator XX, and 21.6 parts of methoxydiphenylphosphine are added dropwise to this mixture at 50°–55° C., whilst stirring. Stirring is continued for 3 hours at 50° C. and the product is then recrystallized directly from toluene. 32 parts of yellowish crystals are obtained. Melting point: 124°–126° C.

Further highly active initiators which were synthesized by a similar method are shown in Table 2.

TABLE 2

Examples of highly active acylphosphine oxide derivatives

|   |   | Yield | b.p. (mm) | m.p. [°C.] | Analysis C | H | P |
|---|---|---|---|---|---|---|---|
| XX | 2,4,6-Trimethylbenzoyl-diphenylphosphine oxide | 87% | — | 80–81 | calc. 75.86 found 75.9 | 6.03 6.1 | 8.91 8.9 |
| XXI | 2,6-Dimethoxybenzoyl-diphenylphosphine oxide | 88% | — | 124–126 | calc. 68.85 found 68.7 | 5.19 5.4 | 8.47 8.2 |
| XXII | 2,6-Dichlorobenzoyl-diphenylphosphine oxide | 82% | — | 154–159 | calc. 60.8 found 60.9 | 3.47 3.7 | 8.27 8.1 |
| XXIII | 2,3,5,6-Tetramethyl-benzoyl-diphenyl-phosphine oxide | 63% | — | 123–125 | calc. 76.24 found 76.2 | 6.36 6.5 | 8.56 8.4 |
| XXIV | Methyl 2,4,6-trimethyl-benzoylphenylphosphinate | 81% | — | 51–52 | calc. 67.55 found 67.5 | 6.29 6.5 | 10.26 10.1 |

UV curing activity

To measure the curing activity, the temperature in the unsaturated polyester resin (UP resin) or vinyl ester resin during UV exposure was recorded as a function of time; for this purpose, a thermocouple, coated with a layer of wax, and connected to a temperature recorder (Tastotherm Script 3 N, standard thermocouple T 300 from Deutsche Gulton GmbH) was immersed in a tinplate lid, of 5 cm diameter, filled with 10 g of resin (thickness of resin layer 4.8 mm). To avoid heat losses during UV exposure, the lid was embedded in a rigid polyurethane foam. The radiation source was a battery of 5 UV fluorescent tubes (TLAK 40 W/05, Philips) arranged next to one another. The distance between the lamps and the resin surface was 8.5 cm.

From the recorded temperature/time curves, the curing time $HZ_{25° C.}$-$T_{max}$ and the maximum curing temperature reached, $T_{max}$, were read off as characteristic parameters for the curing activity. The curing time is the time over which the same temperature rises from 25° C. to $T_{max}$.

EXAMPLE 1

Formulations of resin C with 0.2% of various sensitizers were cured with UV light by the method described above.

A comparison of the curing activity (Table 3) shows that initiator X according to the invention permits the most rapid curing; this is followed by benzil dimethylketal (I), as the most advantageous of the products known from the literature, some of which are commercially available. Further comparative experiments were therefore in the main carried out with the said initiator X.

TABLE 3

UV curing of resin C with 0.2% of various sensitizers, using a 4.8 mm thick layer

| UV sensitizer | $HZ_{25°C.}$-$T_{max}$ [min/s] | $T_{max}$ [°C.] |
|---|---|---|
| I | 8/10 | 123 |
| II | 10/25 | 119 |
| III | 11/50 | 110 |
| IV | 10/00 | 123 |
| X | 7/15 | 125 |

EXAMPLE 2

TABLE 4

UV curing activity of sensitizers according to the invention, compared to benzil dimethylketal (I)

| Resin | Sensitizer | (%) | $HZ_{25°C.}$-$T_{max}$ [min/s] | $T_{max}$ [°C.] |
|---|---|---|---|---|
| A | X | 0.2 | 5/36 | 122 |
|  | XI | 0.2 | 15/00 | 124 |
|  | XI | 0.35 | 15/15 | 122 |
|  | XII | 0.35 | 14/45 | 120 |
|  | XIII | 0.35 | 21/15 | 109 |
|  | XIV | 0.35 | 8/15 | 117 |
|  | XV | 0.2 | 13/45 | 90 |
|  | XV | 0.35 | 16/15 | 86 |
|  | XVI | 0.2 | 15/15 | 90 |
|  | XVI | 0.35 | 16/00 | 88 |
|  | XVII | 0.2 | 10/40 | 96 |
|  | XVII | 0.35 | 11/05 | 98 |
|  | XVIII | 0.35 | 18/15 | 106 |
|  | XIX | 0.35 | 39/25 | 85 |
|  | I | 0.2 | 6/54 | 120 |
| B | X | 0.2 | 5/50 | 127 |
|  | X | 0.35 | 4/40 | 126 |
|  | XI | 0.35 | 10/05 | 133 |

TABLE 4-continued

UV curing activity of sensitizers according to the invention, compared to benzil dimethylketal (I)

| Resin | Sensitizer | (%) | HZ$_{25°C}$-T$_{max}$ [min/s] | T$_{max}$ [°C.] |
|---|---|---|---|---|
|  | XVIII | 0.35 | 13/00 | 112 |
|  | I | 0.2 | 5/30 | 128 |
| C | X | 0.2 | 7/15 | 125 |
|  | XVIII | 0.35 | 18/45 | 112 |
|  | I | 0.2 | 8/15 | 136 |
| D | X | 0.2 | 5/45 | 123 |
|  | I | 0.2 | 8/00 | 128 |
| E | X | 0.2 | 9/00 | 107 |
|  | X | 0.5 | 9/00 | 102 |
|  | I | 0.2 | 13/00 | 102 |
|  | I | 0.5 | 11/15 | 89 |
| F | X | 0.2 | 7/15 | 111 |
|  | I | 0.2 | 10/30 | 127 |

EXAMPLE 3

UP resins containing UV absorbers are employed to prepare UV-stabilized molded products, for example finishing coats or lighting panels. These absorbers can reduce the rate of UV curing. The extent to which this effect manifests itself is shown by the experiments which follow.

Formulations of resin A, commercial UV absorbers (0.1%) and 0.2% of sensitizer I or X were cured by means of fluorescent tubes, as described for the reactivity measurement. The results, in Table 5, show that the formulations containing UV absorber are, as expected, slower-reacting than those which are not UV-stabilized. At the same time, however, it is clear that the formulations according to the invention cure very much more rapidly than those containing sensitizer I.

TABLE 5

UV curing of light-stabilized formulations of resin A

| Sensitizer (0.2%) | UV stabilizer (0.1%) | HZ$_{25°C}$-T$_{max}$ [min/s] | T$_{max}$ [°C.] |
|---|---|---|---|
|  | — | 5/36 | 122 |
| X | ®Cyasorb UV 531[1] | 14/00 | 97 |
|  | ®Sanduvor EPU[2] | 10/30 | 117 |
|  | — | 6/54 | 120 |
| I | Cyasorb UV 531 | 33/15 | 89 |
|  | Sanduvor EPU | 20/00 | 110 |

[1]Manufactured by American Cyanamid
[2]Manufactured by Sandoz

EXAMPLE 4

To determine the influence of added mineral filler on the rate of UV curing, resin A, sensitized with 0.2% of initiator X, was UV-cured in the presence of various fillers (radiation source: TUV 40 W/05 fluorescent tube from Philips). The curing time and maximum curing temperature T$_{max}$ were obtained from the temperature-time curve recorded by the method of measurement described.

Table 6 shows the results of these tests.

TABLE 6

UV curing of filled formulations[1] of resin A

| Filler (%) |  | HZ$_{25°C}$-T$_{max}$ [min/s] | T$_{max}$ [°C.] |
|---|---|---|---|
| Hydrated alumina (®Martinal BM2)[2] | (30) | 7/50 | 117 |
| Silica | (2) | 8/30 | 129 |
| Gypsum (CaSO$_4$ . 2H$_2$O) | (30) | 8/40 | 111 |
| Barium sulfate | (30) | 8/40 | 87 |
| Quartz powder | (30) | 6/00 | 112 |

[1]The molded articles (disks) were 4.8 mm thick.
[2]Manufactured by Martinswerke, Bergheim/Erft, West Germany.

EXAMPLE 5

The curing activity of formulations according to the invention, based on resin A, were also determined using the longer-wavelength radiation of a lamp doped with sodium iodide (HRI, 2000 W, "Power-Star"). In contrast to the procedure described, the distance from the lamp to the substrate surface was 60 cm.

TABLE 7

UV curing of molding compositions according to the invention, containing 0.2% of initiator

| Sensitizer | HZ$_{25°C}$-T$_{max}$ [min/s] | T$_{max}$ [°C.] | Color of the molded material |
|---|---|---|---|
| I | 9/00 | 140 | deep yellow |
| X | 6/45 | 142 | water-white |
| XI | 9/25 | 145 | water-white |
| XII | 10/55 | 170 | water-white |
| XV | 13/10 | 120 | water-white |
| XVIII | 14/10 | 135 | water-white |

The molded materials obtained from compositions according to the invention show no yellowing, in contrast to those containing benzil dimethylketal (I).

EXAMPLE 6

Preparation of glass fiber-reinforced UP molding compositions (a) Glass fiber mat laminates (containing 25% of glass fibers) of 5 and 10 mm thickness were prepared from resin A (formulated with 0.15% of benzil dimethylketal (batch 1) or with 0.15% of pivaloyl-diphenylphosphine oxide (batch 2)) and were irradiated with UV light (TUV 40 W/05 fluorescent tubes, Philips) at a distance of 11 cm. After various exposure times, the Barcol hardness (using a Barcol-Impressor, model 934-1) was measured on the side of the laminate which faced away from the light source. The results are summarized in Table 8.

TABLE 8

UV curing of glass fiber-reinforced UP laminates

| Exposure time [min] | 5 mm laminate Barcol hardness | | Exposure time [min] | 10 mm laminate Barcol hardness | |
|---|---|---|---|---|---|
|  | Batch 1 | Batch 2 |  | Batch 1 | Batch 2 |
| 14 | 0 | 0 | 45 | 0 | 0 |
| 16 | 0 | 4–6 | 50 | 0 | 2–4 |
| 18 | 0–4 | 12–20 | 55 | 0 | 4–20 |
| 20 | 0–10 | 25–30 | 60 | 0 | 10–20 |
| 25 | 6–15 | 34–38 | 70 | 0 | 20–35 |
| 30 | 20–30 | 42–46 | 80 | 0 | 25–35 |
| 35 | 28–35 | — | 100 | 0 | 28–37 |
| 40 | 35–45 | — |  |  |  |

(b) For curing with a high-pressure mercury vapor lamp, mat laminates 9 mm thick (and containing 39% of glass fibers) were prepared, from batches 1 and 2, on a polyester film, and rotated, on a rotating table, under the UV lamps and at a distance of 35 cm therefrom. The effective exposure time was 3 minutes.

The Barcol hardness was determined, after cooling of the moldings, on the side facing away from the lamp.

Here again, the initiator according to the invention, namely pivaloyldiphenylphosphine oxide X, proved superior to benzil dimethylketal (I). The Barcol hardness was 50 for batch 2 and zero for batch 1.

EXAMPLE 7

UV curing of blocks of UP resin A (a) 1,800 g portions of resin A, containing, as the catalyst, either benzil dimethylketal (I; 0.05%) or pivaloyldiphenylphosphine oxide (X, 0.05%), contained in molds made from glass plates (16×11×11 cm), with the inner side walls lined with yellow plastics film, were exposed to fluorescent tubes (TUV 40 W/0.5 Philips). The experimental arrangement was such that the UV light, from a battery of 10 lamps arranged next to one another (overall size 87×49 cm), was able to enter the resin formulations from below, through the bottom of the glass mold. The distance from lamp to mold was 17 cm and the thickness of material to be cured was 9 cm.

These experiments showed clearly that the sensitizer system according to the invention permits substantially more rapid curing than does benzil dimethylketal. Whilst with the latter, 9 hours' exposure gives a yellow molding, the upper layer of which is still fluid, 1½ hours' exposure of the formulation according to the invention gives a pale fully cured molding.

(b) In further experiments, the depth to which various resin formulations were incipiently cured was measured as a function of the irradiation time. For this purpose, the sensitized mixtures of resin A and photoinitiators, contained in a crystallizing dish (diameter 9 cm), to the side walls of which was glued UV-opaque paper (Tesakrepp) were exposed from above to fluorescent tubes (TUV 40 W/05, Philips). The distance from the resin surface to the radiation source was 11 cm.

A narrow vertical inspection slot in the paper glued to the wall made it possible to measure the progress of the curing in the deeper layers. The boundary between the cured and the uncured resin layer was easily recognizable because of the differences in refractive index. The results are summarized in Table 9.

Whilst with benzil dimethylketal only 18 out of 62 mm were cured in 80 minutes, 62 mm, ie. the entire block, were cured with pivaloyldiphenylphosphine oxide (X). By adding tert.-butyl peroctoate, the curing time was reduced to 30 minutes.

TABLE 9

UV curving of thick layers of resin formulations

| Composition | Total thickness of layer [mm] | Exposure time [min] | Thickness of incipiently cured layer [mm] |
|---|---|---|---|
| Resin A | 62 | 10 | 8 |
|  |  | 20 | 14 |
| + benzil dimethyl-ketal (0.15%) |  | 30 | 18 |
|  |  | 60 | 18 |
|  |  | 80 | 18 |
| Resin A | 62 | 10 | 13 |
|  |  | 20 | 21 |
| + pivaloyldiphenyl-phosphine oxide[1] (0.15%) |  | 30 | 28 |
|  |  | 40 | 34 |
|  |  | 50 | 41 |
|  |  | 60 | 48 |
|  |  | 70 | 55 |
|  |  | 80 | 62 |
| Resin A | 60 | 10 | 18 |
| + pivaloyldiphenyl-phosphine oxide (0.15%) |  | 20 | 32 |
|  |  | 30 | 60 |
| + tert.-butyl peroctoate (0.15%) |  |  |  |
| Resin A | 45 | 10 | 7 |
| + versatoyldiphenyl-phosphine oxide (XV) (0.2%) |  | 20 | 11 |
|  |  | 30 | 14 |
|  |  | 60 | 18 |
|  |  | 120 | 45 |

[1]0.187% of an 80% strength paste of the initiator in dibutyl phthalate was employed.

EXAMPLE 8

To assess the yellowing of UP resin moldings exposed to light, 4.8 mm thick disks (diameter 5 cm) of various resins, sensitized with 0.2% of UV initiator, were cured by exposure to fluorescent tubes (TUV 40 W/05, Philips) and then exposed for 40 minutes, at room temperature, to the radiation from a UV battery of 10 fluorescent tubes of the stated type. The distance from the radiation source to the surface of the disks was 11 cm.

The yellowing was assessed from the Yellowness Index according to ASTM D 1925-67. The measurement was carried out with a Zeiss DMC 25 instrument, by transmitted light.

The results in Table 10 show unambiguously that the moldings obtained from the formulations according to the invention in all cases show less yellowing than moldings of conventional formulations (containing sensitizers I–IV).

TABLE 10

Yellowing of UV-cured moldings obtained from various UP resins

| UP resins | UV sensitizer (0.2%) | Yellowness Index |
|---|---|---|
| A | I | 5.74 |
|  | II | 5.43 |
|  | III | 5.33 |
|  | IV | 4.21 |
|  | X | 2.84 |
|  | XI | 2.59 |
|  | XII | 1.82 |
|  | XVIII | 2.61 |
|  | XV | 2.75 |
|  | XVI | 2.87 |
| B | I | 10.84 |
|  | II | 9.18 |
|  | III | 6.10 |
|  | IV | 5.93 |
|  | X | 3.81 |
|  | XI | 4.93 |
|  | XII | 3.73 |
|  | XVIII | 5.38 |
| F | I | 7.28 |
|  | II | 5.62 |
|  | III | 4.83 |
|  | IV | 5.55 |
|  | X | 3.37 |
|  | XI | 3.39 |
|  | XII | 3.37 |
|  | XVIII | 3.58 |
| E | I | 13.37 |
|  | X | 6.00 |

EXAMPLE 9

To confirm that on UV curing of peroxide-containing molding compositions the sensitizers according to the invention again give less colored products, formulations of resin A, tert.-butyl peroctoate and sensitizers I, II and X, in a UV-transmitting mold (5.3×3.4×1.45 cm) were exposed for 25 minutes, at a distance of 15cm, to fluorescent tubes (TUV 40 W/05, Philips). The blocks, after having cooled, were exposed to light from the same UV lamps for 1 hour at room temperature.

The molding containing sensitizer X shows the lowest yellowness index, ie. its yellowing is least (Table 11).

TABLE 11

Yellowing of peroxide-containing UV-cured moldings of resin A

| Sensitizer (0.35%) | tert.-Butyl peroctoate [%] | Yellowness Index |
|---|---|---|
| I | 0.05 | 6.04 |
| II | 0.1 | 5.10 |
| X | 0.1 | 3.37 |

EXAMPLE 10

Production of a finishing coat which can be pressed onto paper laminates or GRP surfaces.

By way of example, a film, about 100 μm thick, of a formulation of resin A, 0.5% of sensitizer X and 1% of benzoyl peroxide was applied to a release film and passed under a high-pressure mercury vapor lamp at a rate of 1 m/min.

The distance from lamp to film was 25 cm. The finishing coat, surface-cured in this way, could be hot-pressed onto a paper laminate or a GRP surface. The finishing coat was free from yellowing.

In Examples 11 to 17 below, the particularly preferred highly reactive UV sensitizers were employed.

EXAMPLE 11

Formulations of UP resins A, C, G and B, and of vinyl ester resin K, with 0.2% of various sensitizers were cured with UV light in the manner described above.

A comparison of the curing activities (Table 12) shows that the most rapid curing is achievable with initiators XX to XXIV. It is true that pivaloyl-diphenylphosphine oxide (X) has as high an activity as 2,6-dichlorobenzoyl-diphenylphosphine oxide (XXII), but on storage in UP resins its activity decreases with time.

TABLE 12

UV curing of sensitized UP resins and of a vinyl ester resin, by exposure to fluorescent tubes

| UP resin or vinyl ester resin | UV initiator (0.2%) | $HZ_{25°C}$-$T_{max}$ [min/s] | $T_{max}$ [°C.] |
|---|---|---|---|
| A | I | 8/00 | 114 |
| C | I | 9/45 | 119 |
| G | I | 10/15 | 123 |
| B | I | 8/30 | 122 |
| K | I | 15/53 | 63 |
| A | III | 13/22 | 104 |
| C | III | 13/07 | 109 |
| G | III | 13/15 | 114 |
| B | III | 11/15 | 108 |
| A | IV | 13/22 | 100 |
| C | IV | 11/30 | 117 |
| G | IV | 11/15 | 123 |
| B | IV | 9/08 | 122 |
| A | X | 7/30 | 107 |
| C | X | 6/45 | 116 |
| G | X | 6/38 | 123 |
| B | X | 5/30 | 123 |
| A | XX | 4/30 | 125 |
| C | XX | 4/00 | 129 |
| G | XX | 3/38 | 127 |

TABLE 12-continued

UV curing of sensitized UP resins and of a vinyl ester resin, by exposure to fluorescent tubes

| UP resin or vinyl ester resin | UV initiator (0.2%) | $HZ_{25°C}$-$T_{max}$ [min/s] | $T_{max}$ [°C.] |
|---|---|---|---|
| B | XX | 3/15 | 127 |
| K | XX | 5/35 | 92 |
| A | XXI | 5/23 | 120 |
| C | XXI | 5/00 | 123 |
| G | XXI | 4/25 | 132 |
| B | XXI | 4/15 | 125 |
| K | XXI | 6/30 | 91 |
| A | XXII | 7/08 | 105 |
| C | XXII | 6/35 | 111 |
| B | XXII | 5/51 | 115 |
| K | XXII | 10/45 | 72 |
| A | XXIII | 5/15 | 102 |
| C | XXIII | 4/45 | 119 |
| B | XXIII | 4/36 | 122 |
| K | XXIII | 6/30 | 87 |
| A | XXIV | 6/15 | 94 |
| C | XXIV | 4/38 | 110 |
| K | XXIV | 7/38 | 91 |

EXAMPLE 12

Formulations of UP resins A and B and of various UV initiators were stored in closed vessels at 60° C. and the curing activity was then measured at room temperature, as described in Example 11.

Table 13 compares the results of the measurements before and after storage. These show very clearly that initiators XX to XXIV have retained a constant activity under the experimental conditions. Storage experiments over a prolonged period at room temperature (Table 14) point in the same direction.

TABLE 13

Test of the curing activity of UV-sensitized UP resins after storage at 60° C.

| UV initiator (0.2%) | UP resin | UV curing before storage | | Storage time [h] | Curing after storage | |
|---|---|---|---|---|---|---|
| | | $HZ_{25°C}$-$T_{max}$ [min/s] | $T_{max}$ [°C.] | | $HZ_{25°C}$-$T_{max}$ [min/s] | $T_{max}$ [°C.] |
| XX | A | 4/30 | 125 | 106 | 5/00 | 119 |
| XX | A | 4/30 | 125 | 66 | 4/53 | 122 |
| XX | B | 3/15 | 127 | 66 | 3/45 | 127 |
| XXI | A | 5/20 | 119 | 66 | 5/23 | 120 |
| XXI | B | 4/15 | 125 | 66 | 3/38 | 129 |
| XXII | A | 7/08 | 105 | 70 | 7/30 | 93 |
| XXII | B | 5/51 | 115 | 70 | 6/00 | 102 |
| XXIII | A | 5/15 | 102 | 70 | 4/52 | 100 |
| XXIV | A | 6/15 | 94 | 70 | 6/41 | 89 |
| XXIV | C | 4/38 | 110 | 70 | 6/00 | 102 |

EXAMPLE 13

Formulations of UP resins A and B and various UV initiators were stored in closed vessels at room temperature in the dark, and the curing activity was measured from time to time by the method described in Example 11. The results, in Table 14, show that with initiator XX storable UV-curable UP resins are obtained.

TABLE 14

Testing the curing activity of UV-sensitized UP resins after storage at room temperature

| UV initiator | [%] | XX (0.20) | XX (0.35) |
|---|---|---|---|
| UP resin | | A | A |
| Storage time | [d] | 0 | 0 |
| $HZ_{25°C}$-$T_{max}$ | [min/s] | 4/30 | 5/38 |

TABLE 14-continued

Testing the curing activity of UV-sensitized UP resins after storage at room temperature

| | | | |
|---|---|---|---|
| $T_{max}$ | [°C.] | 118 | 118 |
| Storage time | [d] | | |
| $HZ_{25°C}$-$T_{max}$ | [min/s] | 4/00 | 6/00 |
| $T_{max}$ | [°C.] | 113 | 106 |

EXAMPLE 14

To assess the yellowing by light of UP resin moldings, 4.8 mm thick disks (diameter 5 cm) obtained from UP resins A, H and J, which had been sensitized with various UV initiators, were cured by exposure to fluorescent tubes (TL AK 40 W/05, Philips) and then exposed for 60 or 120 minutes at room temperature to the radiation from the same light sources (5 fluorescent tubes arranged next to one another). The distance between the radition source and the surface of the disks was 8.5 cm.

The yellowing was assessed from the yellowness index according to ASTM D 1925-67. The measurement was carried out with the Zeiss DMC 25 instrument, by transmitted light.

The results in Table 15 show unambiguously that the moldings obtained from the formulations according to the invention in all cases show less yellowing than moldings of conventional formulations containing benzil dimethylketal (I).

TABLE 15

Yellowing of UV-cured UP resin moldings

| UP resin | UV initiator [%] | Exposure time [min] | Yellowness Index of the moldings |
|---|---|---|---|
| H | I (0.2) | 60 | 13.18 |
| H | I (0.2) | 120 | 14.56 |
| J | I (0.2) | 60 | 13.88 |
| J | I (0.2) | 120 | 16.38 |
| H | XX (0.2) | 60 | 3.78 |
| H | XX (0.2) | 120 | 4.19 |
| J | XX (0.2) | 60 | 3.82 |
| J | XX (0.2) | 120 | 4.19 |
| A | XXI (0.2) | 60 | 3.08 |
| A | XX (0.15) | 60 | 2.87 |

EXAMPLE 15

UV curing of UP resin molding compositions (a) 60 parts of the formulations of UP resin G respectively containing 0.1% of UV initiator XX or 0.1% of benzil dimethylketal (I) were mixed with 40 parts of Martinal BM 2 filler ($Al_2O_3.3H_2O$, from Martinswerke, Bergheim/Erft) and with 1.5% of magnesium oxide (from Merck, Darmstadt). Several layers of glass fiber mats measuring 10×12 cm were impregnated with these mixtures, allowed to thicken between polyester films for three days at room temperature and then cured by exposure to fluorescent tubes (TL AK 40 W/05), the temperature in the molding composition being monitored by means of a thermocouple. The distance from the light source (5 fluorescent tubes next to one another) to the surface of the molding composition was 8 cm; the exposure time corresponded to the time which the molding composition required to reach the maximum curing temperature.

After cooling of the moldings, the Barcol hardness (Impressor 935) was determined on the top and bottom face.

The results in Table 16 show quite clearly the advantages of the formulation according to the invention, containing UV initiator XX. Using three layers of glass fiber mats, corresponding to a total thickness of from 3.8 to 4.5 mm, an exposure time of 5 min 15 s suffices to achieve adequate curing-in-depth of the molding composition; for a total thickness of from 6.6 to 7.2 mm (7 layers of glass fiber mats) the corresponding figure is about 13 min. In the case of the molding composition based on benzil dimethylketal (I), curing-in-depth of the laminate comprising 7 layers of glass fiber mats is not achieved even if the exposure time is doubled.

TABLE 16

UV curing of a resin mat based on UP resin G, $Al_2O_3 . 3H_2O$ and glass fiber mats

| Initiator (0.1%) | Total thickness[1] [mm] | Layers of glass fiber mats | UV curing $HZ_{25°C}$-$T_{max}$ [min/s] | $T_{max}$ [°C.] | Total thickness cured [mm] | Barcol hardness top/bottom |
|---|---|---|---|---|---|---|
| XX | 3.8–4.5 | 3 | 5/15 | 78 | 3.8–4.5 | 92-94/92-94 |
| XX | 6.6–7.3 | 7 | 13/15 | 80 | 6.6–7.3 | 91-96/85-91 |
| I | 6.6–7.2 | 7 | 25/20 | 62 | 4.5 | 94-96/ 0-10 |

[1]Resin mat make-up:
48.1% of UP resin G, 32.1% of $Al_2O_3 . 3H_2O$ (Martinol BM2), 19.8% of glass fiber mats (Vetrotex textile glas mat M 123-40-450)

(b) Kneadable UP resin molding compositions, free from glass fibers, were prepared by thickening formulations, comprising UP resin G, an $Al_2O_3.3H_2O$ filler (Martinal BM2 from Martinswerke, Bergheim/Erft), 1.5% of light magnesium oxide and 0.1% (based on UP resin) of either UV initiator XX or benzil dimethylketal (I), for 3 days. The weight ratio of UP resin to filler was 60:40.

A 2 cm thick layer of each composition in a tin lid was then exposed for 35 minutes to the radiation from fluorescent tubes (TL AK 40 W/05, Philips), the temperature being monitored by means of a thermocouple immersed to a depth of 1 cm in the molding composition. The distance from the light source to the surface of the molding compositions was 6 cm. After cooling, the uncured lower layer of molding composition was removed mechanically and the Barcol hardness (Impressor 955) of the surface newly created in this way was measured, after cleaning it.

In the case of the molding composition according to the invention, a 12.6 mm thick layer was cured whilst in the case of the conventional molding composition, containing benzil dimethylketal (I), the cured layer was only 7 mm thick (compare Table 17).

TABLE 17

UV curing of thickened resin-filler mixtures

| Initiator (0.1 %) | Layer thickness [mm] | UV curing $T_{max}$[°C.] | Cured layer thickness [mm] | Barcol hardness top/bottom |
|---|---|---|---|---|
| XX | 20 | 63 | 12.6 | 93/65-70 |

TABLE 17-continued

| | UV curing of thickened resin-filler mixtures | | | |
|---|---|---|---|---|
| Initiator (0.1 %) | Layer thickness [mm] | UV curing $T_{max}[°C.]$ | Cured layer thickness [mm] | Barcol hardness top/bottom |
| I | 20 | 42 | 7 | 93/67 |

EXAMPLE 16

10 mm thick layers of formulations of UP resin A and UV sensitizers XX, I and mixtures of both were irradiated with fluorescent tubes (TL-AK 40 W/05, Philips). The UP resin samples were contained in tin plate lids of 5 cm diameter, standing on a cork sheet (5 mm thick) to avoid substantial heat losses. The distance from the fluorescent tubes to the resin surface was 8 cm. After exposure and cooling, a bar was sawn from the moldings, using the total thickness, and the residual styrene content of the bar was determined titrimetrically in accordance with DIN 16,945. The results obtained are summarized in Table 18. They show that the residual styrene contents of the sample moldings containing the sensitizer combination XX plus I are lower than those of the samples containing sensitizers XX and I individually.

TABLE 18

Residual styrene content of UV-cured UP resin moldings based on resin A

| | UV Sensitizer | | | |
|---|---|---|---|---|
| Example | Type | % by weight, based on the weight of components (a) + (b) | Exposure time [min] | Residual styrene content [% by weight] |
| a | XX | 0.1 | 10 | 1.35 |
| | | | 20 | 1.3 |
| b | XX + I | 0.05 + 0.05 | 10 | 1.07 |
| | | | 20 | 0.65 |
| c | XX + I | 0.075 + 0.025 | 10 | 1.06 |
| | | | 20 | 1.8 |
| d | I | 0.1 | 10 | still partially fluid |
| | | | 20 | 1.15 |

EXAMPLE 17

The photocuring of unsaturated polyester resins can also be carried out in two stages using the photoinitiators according to the invention. In the first stage, after a short exposure time, a flexible semi-finished, storable article is produced, which can be shaped, cut and punched, for example to produce buttons. It is subsequently finally cured by renewed exposure, in the second stage.

A 2 mm thick layer, between two polyester films, of an 0.1% strength solution of 2,4,6-trimethylbenzoyl-diphenylphosphine oxide (XX) in resin A was exposed for 1 minute to fluorescent tubes (TL-AK 40 W/05, Philips). The distance from the light source to the resin surface was 10 cm.

A flexible semi-finished article was obtained, which was easy to cut with a sharp knife and simple to shape manually. The Barcol hardness (Barcol Impressor 935) was 0 on both sides.

After 24 hours' storage at room temperature, with exclusion of light, the semi-finished article, which retained its flexibility unchanged, was fully cured by renewed exposure to the fluorescent tubes (exposure time: 15 minutes). After cooling to room temperature, the Barcol hardness of the molding was 87–89, and the material had become rigid.

To avoid substantial heat loss, the semi-finished article rested on a plastic foam sheet during renewed exposure.

We claim:

1. A photocurable molding, impregnating and coating composition comprising a mixture of
   (a) or more ethylenically unsaturated polyesters or vinyl ester resins having the characteristic group
   —CO—OCH$_2$CHOH—CH$_2$O—,
   (b) one or more ethylenically unsaturated copolymerizable monomeric compounds,
   (c) an inhibitor and
   (d) an UV sensitizer,
   with or without
   (e) paraffins, thermally decomposable initiators, fillers, reinforcing agents, lubricants, inert solvents, shrinkage-reducing additives and other assistants usable in unsaturated polyesters,
   wherein the UV sensitizer consists of one or more acylphosphine oxide compounds of the formula

where R$^1$ is straight-chain or branched alkyl of 1 to 6 carbon atoms, cyclohexyl, cyclopentyl, aryl which is unsubstituted or substituted by halogen, alkyl or alkoxy, or a S-containing or N-containing five-membered or six-membered heterocyclic radical, R$^2$ has one of the meanings of R$^1$ (but R$^1$ and R$^2$ may be identical or different), or is alkoxy of 1 to 6 carbon atoms, aryloxy or aralkoxy, or R$^1$ or R$^2$ together stand for an o-phenylenedioxy group, and R$^3$ is a substituted or unsubstituted straight-chain or branched alkyl of 2 to 18 carbon atoms, a cycloaliphatic radical of 3 to 10 carbon atoms, vinyl, phenyl, naphthyl or a S-, O- or N-containing five-membered or six-membered heterocyclic radical or is the group

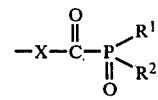

where R$^1$ and R$^2$ have the above meanings and X is phenylene or an aliphatic or cycloaliphatic divalent radical of 2 to 6 carbon atoms.

2. A photocurable molding, impregnating and coating composition as claimed in claim 1, wherein the UV sensitizer is an acylphosphine oxide compound of the formula I, in which R$^1$ and R$^2$ have the above meanings and R$^3$ is a tertiary aliphatic radical.

3. A photocurable molding, impregnating and coating composition as claimed in claim 1, wherein the UV sensitizer is an acylphosphine oxide compound of the formula I, in which R$^1$ and R$^2$ have the above meanings and R$^3$ is cycloalkyl, phenyl, naphthyl or a S-, N- or O-containing five-membered or six-membered heterocyclic radical, which contains substituents A and B at least in the two positions ortho to the carbonyl group, A and B being identical or different and each being alkyl, cycloalkyl, aryl, alkoxy, thioalkyl, carbalkoxy, cyano or halogen.

4. A photocurable molding, impregnating and coating composition as claimed in claim 1, wherein the UV sensitizer is an acylphosphine oxide compound of the formula I, in which $R^1$ and $R^2$ have the above meanings and $R^3$ is 2,4,6-trimethylphenyl.

5. A photocurable molding, impregnating and coating composition as claimed in claim 1, wherein the acylphosphine oxide compound is used in an amount of from 0.005 to 5% by weight, based on the total weight of components (a) and (b).

6. A photocurable molding, impregnating and coating composition as claimed in claim 1, wherein the UV sensitizer is an acylphosphine oxide compound of the formula I, in combination with an aromatic ketone, aromatic disulfide or naphthalenesulfonyl chloride, in a weight ratio of from 85:15 to 15:85.

7. A photocurable molding, impregnating and coating composition as claimed in claim 6, wherein the aromatic ketone is a benzil ketal, benzoin ether or benzoin ether.

* * * * *

UNITED STATES PATENT AND TRADEMARK OFFICE
CERTIFICATE OF CORRECTION

PATENT NO. : 4,265,723
DATED : May 5, 1981
INVENTOR(S) : A. Hesse, P. Lechtken, W. Nicolaus, and D. Scholz It is certified that error appears in the above—identified patent and that said Letters Patent is hereby corrected as shown below:

In claim 1(a), line 9, insert --one-- before "or more".

Signed and Sealed this

Third Day of November 1981

[SEAL]

Attest:

GERALD J. MOSSINGHOFF

Attesting Officer

Commissioner of Patents and Trademarks